United States Patent [19]

Ota et al.

[11] Patent Number: 5,264,412
[45] Date of Patent: Nov. 23, 1993

[54] LASER ABLATION METHOD FOR FORMING OXIDE SUPERCONDUCTING THIN FILMS USING A HOMOGENIZED LASER BEAM

[75] Inventors: Nobuhiro Ota; Tatsuoki Nagaishi; Naoji Fujimori, all of Hyogo, Japan

[73] Assignee: Sumitomo Electric Industries, Ltd., Osaka, Japan

[21] Appl. No.: 743,621

[22] Filed: Aug. 12, 1991

[30] Foreign Application Priority Data

Aug. 18, 1990 [JP]  Japan .................................. 2-217775

[51] Int. Cl.$^5$ ........................... B05D 3/06; B05D 5/12
[52] U.S. Cl. ........................ 505/1; 505/730; 505/732; 427/62; 427/596; 427/126.3
[58] Field of Search ............... 505/1, 732, 730; 427/62, 53.1, 54.1, 63, 596, 126.3; 204/192.24, DIG. 11

[56] References Cited

FOREIGN PATENT DOCUMENTS 2220502  1/1990  United Kingdom .

OTHER PUBLICATIONS

Kwok et al, "Laser evaporation deposition of superconducting and dielectric thin films", Appl. Phys. Lett. 52(21) May 1988, pp. 1825-1827.
Roas et al, "Epitaxial growth of $YBa_2Cu_3O_{7-x}$ thin films by a laser evaporation process", Appl. Phys. Lett. 53(16) Oct. 1988, pp. 1557-1559.
Applied Physics Letters, Feb. 5, 1990, vol. 56, No. 6, "Effects of Beam Parameters on Excimer Laser Deposition of $YBa_2Cu_3O_{7-\delta}$", Muenchausen, et al., pp. 578-580.

*Primary Examiner*—Roy King
*Attorney, Agent, or Firm*—Lowe, Price, LeBlanc & Becker

[57] ABSTRACT

A method is provided for forming a thin film of an oxide superconductor on a substrate by laser ablation. Energy distribution in the section of a laser beam is homogenized within 10%. The homogenized laser beam is applied onto a target. A thin high-quality film of material ablated from the target is thus formed on a substrate which is arranged to face the target.

6 Claims, 4 Drawing Sheets

LASER ABLATION METHOD FOR FORMING OXIDE SUPERCONDUCTING THIN FILMS USING A HOMOGENIZED LASER BEAM

BACKGROUND OF THE INVENTION

1. Field of the Invention

The present invention relates to a method of forming an oxide superconducting thin film. More particularly, it relates to a method of forming a thin film of an oxide superconductor using laser ablation.

2. Description of the Background Art

While thin films are formed by various methods, laser ablation is regarded as a method which is suitable for forming a high-quality thin film since it requires absolutely no electromagnetic field.

Particularly in an excimer laser ablation method employing an excimer laser as a laser source for emitting a high-energy laser beam in a short wavelength region of about 200 nm, it is possible to form a thin film at a high speed under a low substrate temperature. Further, such an excimer laser ablation method is considered a technique suitable for forming a thin film of an oxide superconductor, which is a multi-element compound, due to the following advantages:

1) It is possible to obtain a thin film which has no displacement in composition from a target.

2) The film can be formed in a wide atmosphere pressure region of up to about 1 Torr.

3) The growth rate can be extremely increased.

4) It is a thermal non-equilibrium process with a high-energy beam.

However, the excimer laser is a pulse oscillation type laser, which has an extremely short emission time of about ten-odd nanoseconds in general. In a laser ablation method employing the aforementioned excimer laser as a light source, therefore, the target is intermittently irradiated with a pulsed laser beam.

In a laser ablation method, particles or vapor is generally scattered from a target only when the target is irradiated with a laser beam. Such particles or vapor scattered from the target is deposited on the surface of a substrate to form a thin film, due to reaction on the surface of the substrate. In the excimer laser ablation method, therefore, the particles or vapor is intermittently scattered from the target in response to laser pulses.

In the excimer laser having an extremely short pulse width and high energy, it is possible to generate a large quantity of particles or vapor with a laser beam of a single pulse. Thus, the as-formed film is remarkably influenced by the energy state of the laser.

SUMMARY OF THE INVENTION

An object of the present invention is to provide a method of forming a thin film using laser ablation, which can form an oxide superconducting thin film having excellent superconducting properties. The inventive film forming method is adapted to form a thin film of an oxide superconductor on a substrate by laser ablation, and comprises the steps of homogenizing energy distribution in the section of a laser beam within 10%, applying the laser beam to a target, and forming a thin film on a substrate which is arranged to face the target.

A laser beam which is emitted from an excimer laser generally has large energy distribution in its sectional direction. Namely, the laser beam has small energy in a portion around the periphery of its section and large energy in the central portion.

As to a laser beam which is applied to a target in laser ablation, the inventors have recognized that the range of energy density capable of forming a thin film of good quality is restricted. If the laser beam has low energy density, a large quantity of droplet type deposits are formed in the as-obtained thin film, which has an adverse effect the film quality.

Thus, if the energy density is adjusted at a proper level in the central portion of the laser beam, the energy is undesirably reduced at the peripheral portion of the laser beam. In this case, a trace of melting is recognized in a peripheral portion of a part, which is irradiated with the laser beam, in the target after film formation. Thus, it is estimated that droplet type particles generated in this portion form deposits in the thin film.

In order to form an oxide superconducting thin film of high quality, therefore, it is extremely important to homogenize energy distribution within the applied laser beam.

The principal feature of the present invention resides in that energy distribution in the section of a laser beam which is applied to a target is adjusted to be within 10% in formation of an oxide superconducting thin film on a substrate by laser ablation. According to the inventive method, it is possible to form a homogeneous thin film since a homogeneous laser beam is applied to the target.

The inventive method can be implemented by combining a biprism with a pair of lenses for reinforcing a weak portion in the periphery of the laser beam, or providing an apparatus for equalizing a strong central portion in an optical path of the laser beam between a laser source and a chamber.

According to the present invention, it is possible to form a high-quality thin film by laser ablation. An oxide superconducting thin film formed by the inventive method is optimum for application to an electronic device such as a Josephson device, a superconducting transistor or the like.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
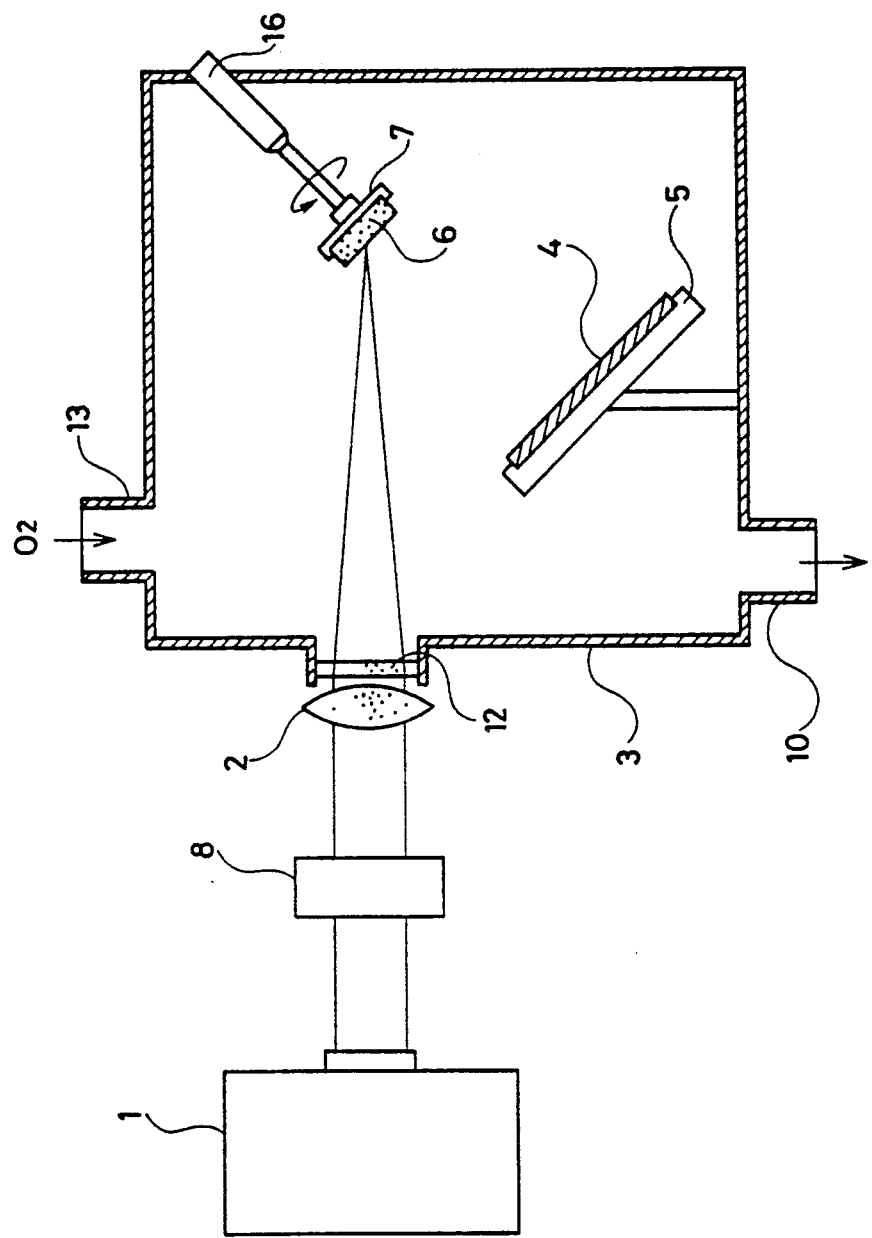
FIG. 1 schematically illustrates a laser ablation apparatus for carrying out the method according to the present invention.

FIG. 1 schematically illustrates a laser ablation apparatus for carrying out the method according to the present invention. The laser ablation apparatus shown in FIG. 1 comprises a chamber 3 which has a laser entrance window 12, an oxygen inlet port 13 and an exhaust port 10 so that its interior can be evacuated in a high vacuum state through the exhaust port 10, a substrate holder 5 which is provided in its interior with a heater for a substrate and arranged in the chamber 3, and a target holder 7 which is rotated by a motor 16.

An excimer laser 1, a laser beam homogenizer 8 for homogenizing a laser beam and a condenser lens 2 for condensing the laser beam are arranged in the exterior of the chamber 3.

The laser beam which is emitted from the laser 1 is homogenized by the laser beam homogenizer 8 so that energy distribution in its sectional direction is within 10%. The laser beam outgoing from the laser beam homogenizer 8 is condensed by the condenser lens 2 and introduced into the laser entrance window 12 of the chamber 3, to be applied to a raw material target 6 which is fixed to the target holder 7. The laser beam is adapted to hit a position which is slightly displaced from the center of the target 6. The target 6 is so rotated by the motor 16 that the same is not partially but entirely irradiated with the laser beam.

Figure 2:
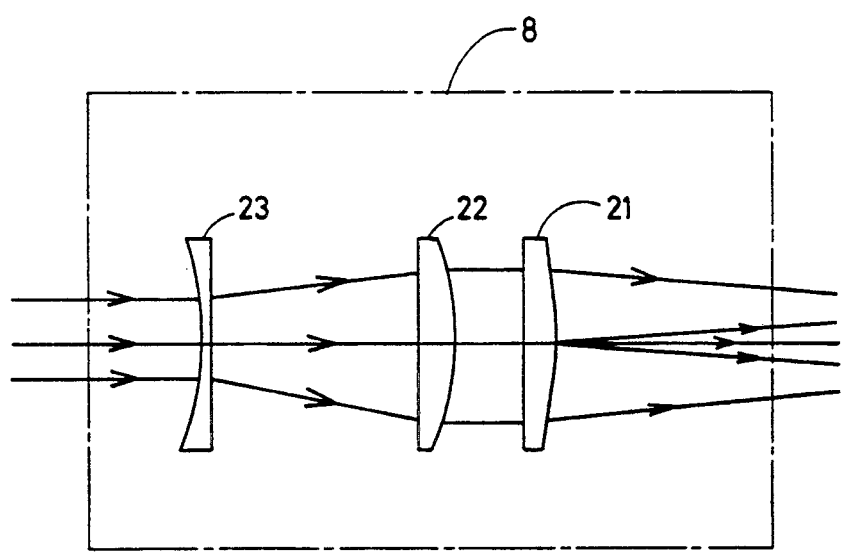
FIG. 2 is a sectional view schematically showing an exemplary laser beam homogenizer.

FIG. 2 is a sectional view schematically showing the laser beam homogenizer 8 provided in the aforementioned apparatus. The laser beam homogenizer 8 shown in FIG. 2 is provided with a set of a biprism 21, a convex lens 22 and a concave lens 23, which are arranged in series with each other at appropriate spacings.

Figure 3:
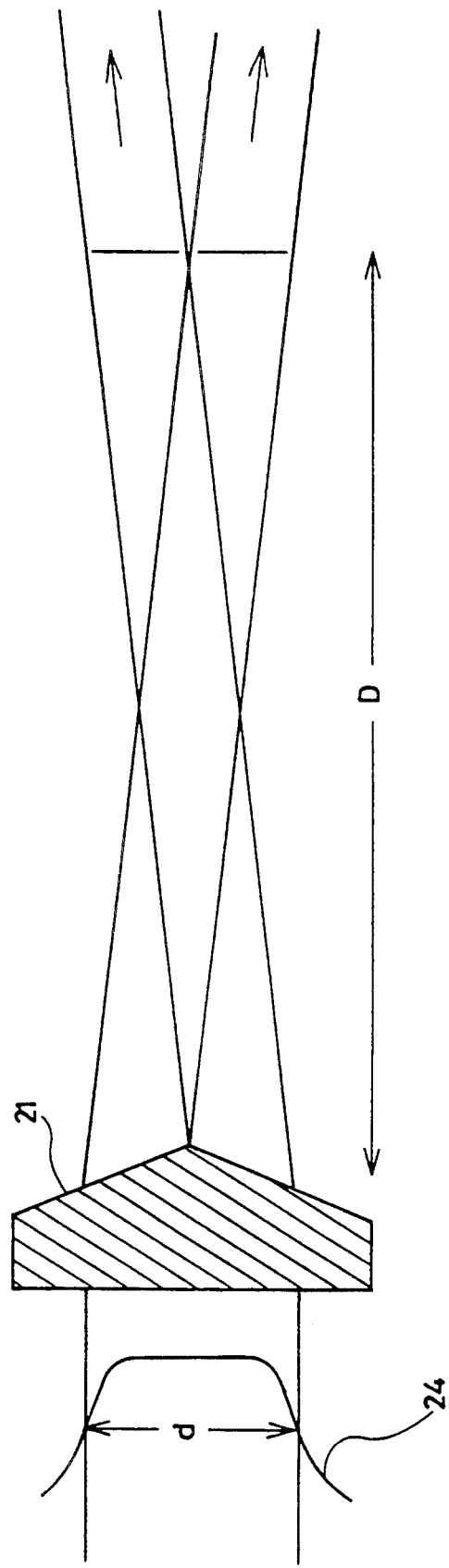
FIG. 3 shows a principle of operation of the laser beam homogenizer.
Figure 4:
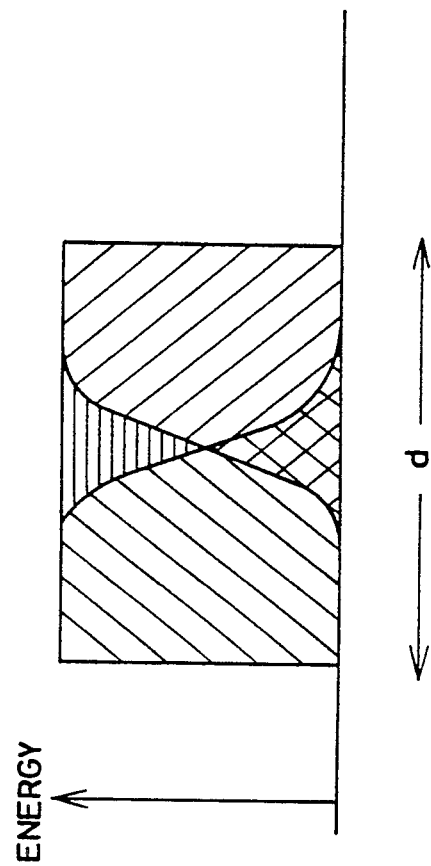
FIG. 4 is a diagram showing the distribution of energy of the homogenenized laser beam.

FIG. 3 shows a principle of operation of the laser beam homogenizer. An input beam 24, of which diagram shows the distribution of energy of the same, goes into the biprism 21 and is splitted into two beams which have different progressive directions. The distance d corresponds to the width between ½ energy points. At a distance D from the biprism 21, the peripheral portions of the two beams compensate each other and, as a result, the distribution of the energy is improved as shown in FIG. 4. The energy distribution in the section of a laser beam can be homogenized within 10%.

The aforementioned apparatus was used to form oxide superconducting thin films according to the inventive method.

EXAMPLE 1

An MgO single crystal substrate 4 was arranged in the apparatus shown in FIG. 1, and the target 6 was prepared by sintering $YBa_2Cu_3O_7$ powder, to form an oxide superconducting thin film. The spacing between the substrate holder 5 and the target 6 was 40 mm. The substrate temperature was set at 700° C. The temperature was measured with a sheathed thermocouple, which was formed by a general thermocouple.

The interior of the chamber 3 was evacuated to $1 \times 10^{-7}$ Torr, and thereafter oxygen gas was introduced from the oxygen inlet port 13 to adjust the pressure to 100 mTorr. Then, an excimer laser beam was applied onto the target surface at 1.5 J/cm$^2$ and 5 Hz to form a film for 10 minutes, and thereafter the film was slowly cooled at a cooling rate of 20° C./min.

As to temperature change of electrical resistance, the as-formed thin film lost all electrical resistance at a Curie point ($T_c$) of 90K.

Further, the thin film exhibited a critical current density ($J_c$) of $5.2 \times 10^6$ A/cm$^2$ at 77K.

It was recognized through observation with a scanning electron microscope (SEM) that the thin film had an extremely smooth surface with a negligible number of droplet type deposits, while its surface roughness was about 7 nm through measurement with a surface roughness tester.

EXAMPLE 2

An SrTiO$_3$ single crystal substrate 4 was arranged in the apparatus shown in FIG. 1, and the target 6 was prepared from a compact of $YBa_2Cu_3O_7$ powder, to form an oxide superconducting thin film. The spacing between the substrate 5 and the target 6 was 50 mm, and the substrate temperature was set at 700° C. The pressure within the chamber was adjusted to 100 mTorr in a similar procedure to that in Example 1, and an excimer laser beam was applied onto the target surface at 1.5 J/cm$^2$ and 5 Hz, to form a film for 10 minutes. Thereafter the film was slowly cooled at a cooling rate of 20° C./min.

As to temperature change of electrical resistance, the as-formed thin film lost all electrical resistance at a temperature ($T_c$) of 90K. Further, the film exhibited a critical current density ($J_c$) of $8.0 \times 10^6$ A/cm$^2$ at 77K.

Through SEM observation, it was recognized that this film had an extremely smooth surface with a negligible number of droplet type deposits similarly to the thin film formed according to Example 1, while the surface roughness measured by a surface roughness tester was about 5 nm.

COMPARATIVE EXAMPLE

In the apparatus shown in FIG. 1, no laser homogenizer 8 was employed but an SrTiO$_3$ single crystal substrate 4 was arranged and the target 6 was prepared by sintering $YBa_2Cu_3O_7$ powder similarly to Example 2, to form an oxide superconducting thin film. The film was formed for 10 minutes with a procedure and conditions similar to those of Example 2. Thereafter the film was slowly cooled at a cooling rate of 20° C./min.

The as-formed thin film lost all electrical resistance at a temperature ($T_c$) of 85K. This film exhibited a critical current density ($J_c$) of $1.0 \times 10^6$ A/cm$^2$ at 77K.

Through SEM observation, a large quantity of droplet type deposits were observed on the surface of the thin film, while the surface roughness measured with a surface roughness tester was more than 100 nm.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. In a method of forming a smooth-surfaced film of an oxide superconductor material on a substrate by applying laser beam to cause ablation of a target made of the oxide superconductor material for deposition of ablated target material on the substrate, the improvement comprising the step of:
    homogenizing an energy distribution in a section of said laser beam within 10%.

2. A method of forming a smooth-surfaced film in accordance with claim 1, wherein:
    said homogenizing step comprises passing the laser beam through a biprism element before applying the homogenized laser beam to the target.

3. A method of forming a smooth-surfaced film in accordance with claim 1, comprising the further step of:
    rotating said target while applying said homogenized laser beam so that said target is entirely irradiated with said homogenized laser beam.

4. A method of forming a smooth surfaced film in accordance with claim 3, wherein:

said homogenizing step comprises passing the laser beam through a biprism element before applying the homogenized laser beam to the target.

5. A method of forming a smooth-surfaced film in accordance with claim 2, wherein:

said homogenized laser beam is applied to said target at a position which is displaced from a center of the target.

6. A method of forming a smooth-surfaced film in accordance with claim 5 wherein:

rotating said target while applying said homogenized laser beam so that said target is entirely irradiated with said homogenized laser beam.

* * * * *